United States Patent [19]

Driller et al.

[11] Patent Number: 5,399,982
[45] Date of Patent: Mar. 21, 1995

[54] PRINTED CIRCUIT BOARD TESTING DEVICE WITH FOIL ADAPTER

[75] Inventors: Hubert Driller; Paul Mang, both of Schmitten, Germany

[73] Assignee: Mania GmbH & Co., Weilrod, Germany

[21] Appl. No.: 56,767

[22] Filed: May 4, 1993

Related U.S. Application Data

[63] Continuation-in-part of Ser. No. 818,091, Jan. 8, 1992, Pat. No. 5,228,189, which is a continuation of Ser. No. 433,833, Nov. 13, 1989, Pat. No. 5,109,596.

[30] Foreign Application Priority Data

Nov. 6, 1992 [DE] Germany .................. 42 37 591.6

[51] Int. Cl.⁶ .................. G01R 1/06; G01R 15/12
[52] U.S. Cl. ...................... 324/754; 324/755; 29/705; 439/66
[58] Field of Search .................. 29/705, 729, 739, 759, 29/760, 884; 324/72.5, 158 P, 158 F, 754, 755; 439/54, 65, 66, 67, 91, 77, 482, 912, 912.1, 912.2

[56] References Cited

U.S. PATENT DOCUMENTS

| | | | |
|---|---|---|---|
| 4,099,120 | 7/1978 | Aksu | 324/72.5 X |
| 4,357,062 | 11/1982 | Everett | 439/54 |
| 4,443,756 | 4/1984 | Lightbody et al. | 324/158 F X |
| 4,528,500 | 7/1985 | Lightbody et al. | 324/158 F X |
| 4,571,542 | 2/1986 | Arai | 324/158 P |
| 4,793,814 | 12/1988 | Zifcak et al. | 439/66 |
| 4,820,976 | 4/1989 | Brown | 324/158 P |
| 4,833,402 | 5/1989 | Boegh-Petersen | 324/158 F |
| 4,926,117 | 5/1990 | Nevill | 324/158 P |
| 5,207,585 | 5/1993 | Byrnes et al. | 439/67 X |

FOREIGN PATENT DOCUMENTS

| | | |
|---|---|---|
| 2639154 | 5/1990 | France ............ 439/66 |
| 0144682 | 10/1984 | Germany . |
| 0184619 | 9/1985 | Germany . |
| 87G445401 | 7/1988 | Germany . |
| 8809592U1 | 11/1988 | Germany . |
| 3838413 | 5/1990 | Germany . |
| 2156532A | 3/1984 | United Kingdom . |
| WO86/00173 | 1/1986 | WIPO . |

OTHER PUBLICATIONS

Patent Abstracts of Japan, vol. 7, No. 278, Dec. 10, 1983.
IBM Corp., Technical Disclosure Bulletin, vol. 21, No. 8, Jan. 8, 1979, "Test Probe Contact Grid Translator Board", U. Renz, pp. 3235–3236.
IBM Corp., Technical Disclosure Bulletin, vol. 24, No. 74, Dec., 1981, "Conformal Multi-Probe Tester Assembly", D. O. Powell and J. Rasile, pp. 3342–3344.

*Primary Examiner*—Peter Dungba Vo
*Attorney, Agent, or Firm*—Wenderoth, Lind & Ponack

[57] ABSTRACT

Printed circuit board testing device includes contacts arranged in a pre-determined basic grid pattern, and a pressure device for urging a printed circuit board into engagement with an adapter arrangement for electrically connecting test specimen-specific test points of the printed circuit board to be tested to grid-oriented contacts of the basic grid pattern of the printed circuit board testing device. The adapter arrangement includes a flexible adapter foil that carries on the side facing the basic grid pattern preferably regularly-arranged lands and on the side facing the test specimen test specimen-specific lands that are in direct contact with the test points of the printed circuit board to be tested. The mutually-assigned lands are electrically interconnected on both sides of the adapter foil by plated-through holes and, if necessary, associated printed conductors. In order to provide compensation for manufacturing deviations of the very small test points from a reference position, provision is made for the adapter foil and the printed circuit board to be retained in the adapter arrangement and displaced relative to each other in their plane. The adapter foil can also be elastically elongated or stretched in its plane.

25 Claims, 4 Drawing Sheets

PRINTED CIRCUIT BOARD TESTING DEVICE WITH FOIL ADAPTER

CROSS-REFERENCE TO RELATED APPLICATIONS

This is a continuation-in-part of copending application Ser. No. 07/818,091, filed Jan. 8, 1992 and now U.S. Pat. No. 5,228,189, which in turn is a continuation of Ser. No. 07/433,833, filed Nov. 13, 1989 and now U.S. Pat. No. 5,109,596.

BACKGROUND OF THE INVENTION

1. Field of the Invention

This invention concerns a printed circuit board testing device having an adapter or a contact arrangement for electrically connecting the regular basic grid of an electronic testing device for single-layer or multi-layer, board-type wiring planes, such as printed circuit boards, ceramic substrates and the like, to the not necessarily grid-oriented contacts/connecting points of the wiring plane (test specimen) to be tested, which are in the form of metallic contact areas or connecting holes on one or both surfaces of the test specimen. In the test being discussed here, the wiring planes are not usually fitted with active electrical/electronic components, except where an IC or the like is being tested. In this connection it should be pointed out that the printed circuit board testing devices in question can be used for testing one side or both side of printed circuit boards.

2. Description of the Related Art

Many different versions of such contact arrangements (frequently referred to as "adapters" or "test jigs") are know inter alia from the literature "Pat. Abstract of Japan", Vol. 7, No. 278 (P-242) (1423), 10th December 1983 and JP-A-58 55 374 dated Sep. 16, 1983, or from IBM Technical Disclosure Bulletin, Vol. 24, No. 7A, December 1981, pages 3342 to 3344. Further such arrangements are know from GB-A-2 156 532, U.S. Pat. Nos. 4,099,120 and 4,443,756.

Furthermore, EP 184 619 B1 shows a printed circuit board testing device which has a basic contact grid with an "active basic grid" arranged upon it, which consists of spring test pins or contacts arranged in accordance with the basic contact grid in an insulating basic grid body, onto which a rigid adapter plate is laid, which compensates for local, increased connection densities on the test specimen and/or the lateral displacement (in the X and Y directions of this plate) between the regularly-arranged contacts of the basic grid and the not necessarily regularly-arranged contacts of the printed circuit board (test specimen) to be tested. This is achieved by arranging contact areas on one side of the adapter plate in accordance with the basic grid, whereas on the other side of this adapter plate the arrangement of contact areas assigned to the test specimen is identical to that of the test specimen. Printed conductors and plated-through holes on and in the plate, respectively, provide connection between the mutually-related contact area on each side of the adapter plate. In turn, vertically-arranged test probes, spring-loaded in their longitudinal direction, against whose points the contact areas of the test specimen are pressed by a suitable pressure-contact device, make contact with the contact areas of the adapter plate corresponding to the test specimen. Instead of such test probes, a further embodiment of this EP 184 619 B1 provides a "vertical conducting plate" that conducts current only perpendicularly to the plane of the plate. Both this elastically-compressible, vertical conducting plate and the spring test probes between the rigid adapter plate, which make contact with the test specimen, are necessary in order to produce the individual contact pressure required at each contact point for good contact.

In the first embodiment of this previously known arrangement, it is a disadvantage that, apart from the need for the adapter to be manufactured individually according to the usual printed circuit techniques anyway, a large number of spring test probes is also required, the provision of which represents a considerable investment for the user of the test equipment, since these test probes are required in substantially large numbers. In addition, due to the necessary mechanical strength of such spring test probes, limits are placed on their miniaturization and thus on the permissible density of the contacts or test probes.

These previously know problems are partially remedied in the above-mentioned further embodiment of EP 184 619 B1 in that the contact between the side of the adapter plate facing the test specimen and the test specimen itself is effected by the vertical conducting plate, which in principle consists of a mat of elastic, insulating material within which finely distributed contact wires run parallel to each other, perpendicular to the mat, and are thus insulated from each other, and which project at the top and bottom from the surface or the vertical conducting plate. The adapter plate and the test specimen can certainly be connected comparatively easily with the aid of such vertical conducting plates, but the manufacture of such vertical conducting plates is extremely expensive, and the use of such a contacting technique could be impeded by patents and the like in existence in various countries. Furthermore, these vertical conducting plates have only a limited life if they are continually and repeatedly loaded by the contact pressure required for making contact with the test specimens. Due to the continuously repeated bending load, particularly the ends of the contact wires projecting at the surface of the vertical conducting plate break off and gradually lead to the failure of the vertical conducting plate.

An adapter arrangement without test probes for testing devices of the type discussed here is shown in the applicant's EP 369 112 A1. Here, the necessary spring compliance for producing the required contact pressure at each test point of the test specimen is obtained in an embodiment in that a compressible plug of electrically-conductive elastomer is arranged on the essentially rigid adapter plate on each contact area. In a further embodiment described in this publication, this contact pressure is produced at each test point of the test specimen by constructing the adapter plate itself as a thin, flexible foil whose test specimen-specific contact areas are placed directly onto the test points of the test specimen. The side facing away from the test specimen is pressed in the direction of the test specimen by a spring contact arrangement.

This adapter arrangement, at least in the above-mentioned further embodiment, for the first time facilitates direct contact between the adapter foil and the test specimen by removing the means for producing the individual contact pressure at each test point of the test specimen from the area between the test specimen and the adapter plate or adapter foil, respectively. Since the conductive elastomer test probes or plugs with their limited miniaturization capability, or the known vertical conducting plate with its drawbacks as discussed, no longer have to be inserted in the area between the adapter plate or adapter foil, respectively, and the test specimen, after the adapter foil is placed with its test specimen-specific contact areas directly onto the test points of the printed circuit board to be tested, there are promising possibilities for increasing the density of test points which can be tested with an adapter arrangement. But in this adapter technique, which is based on direct contact between a flexible adapter foil and the test specimen in an adapter that is not hard-wired, practical difficulties are soon encountered with greatly increased miniaturization. This is especially true if, as in many current, conventional SMD wiring planes or printed circuit boards, the center-to-center distance between adjacent test points is only 0.2 mm and their area is approximately 0.1×0.5 mm. With such small test points and test point spacings on the test specimen or the test specimen-specific contact areas on the adapter foil, this can lead to contact faults which are entirely due to manufacturing length tolerances in the test specimens or the adapter foil.

SUMMARY OF THE INVENTION

These problems of the related art are solved by this invention, preferably by retaining the adapter foil so that its plane can be displaced in relation to the printed circuit board that is fixed in the adapter arrangement, in order to adjust the adapter foil as required so that the abovementioned contact faults disappear. Alternatively, displacement of the printed circuit board relative to the foil is also possible. In this connection, it can also be advantageous to additionally elongate or stretch the adapter foil elastically.

The preferably, regularly-arranged lands of the adapter foil that face the basic grid are, advantageously, made considerably larger than the possibly very small and possibly locally very densely arranged test specimen-specific lands on the side of the adapter foil facing the test specimen. Consequently, contact between the part of the adapter arrangement arranged between the adapter foil and the basic grid is not then lost if the foil is displaced or stretched by an amount which corresponds to the size of the test specimen-specific lands.

The adapter arrangement according to the invention is especially suitable for printed circuit board test equipment that is set up to test both sides of a printed circuit board simultaneously, because local, mechanical overstressing of the printed circuit board can be reliably avoided by means of the uniformly distributed support provided for all areas of the printed circuit board by the flexible adapter foil which is being supported on its backside by laminar, continuous pressure transmitting part of elastically-compressible insulating material. A further contributory factor is that where the adapter foil makes contact with the side facing away from the test specimen by means of a conventional test probe adapter, the contact areas are preferably regularly arranged. Furthermore, this conventional test probe adapter connection technique avoids so-called "footprints" or impressions of the probe in the test points of the test specimen with which contact is to be made.

BRIEF DESCRIPTION OF THE DRAWINGS

The attached drawings show schematic representations of two practical examples of the present invention. In particular.

DETAILED DESCRIPTION OF THE PREFERRED EMBODIMENTS

Figure 1:
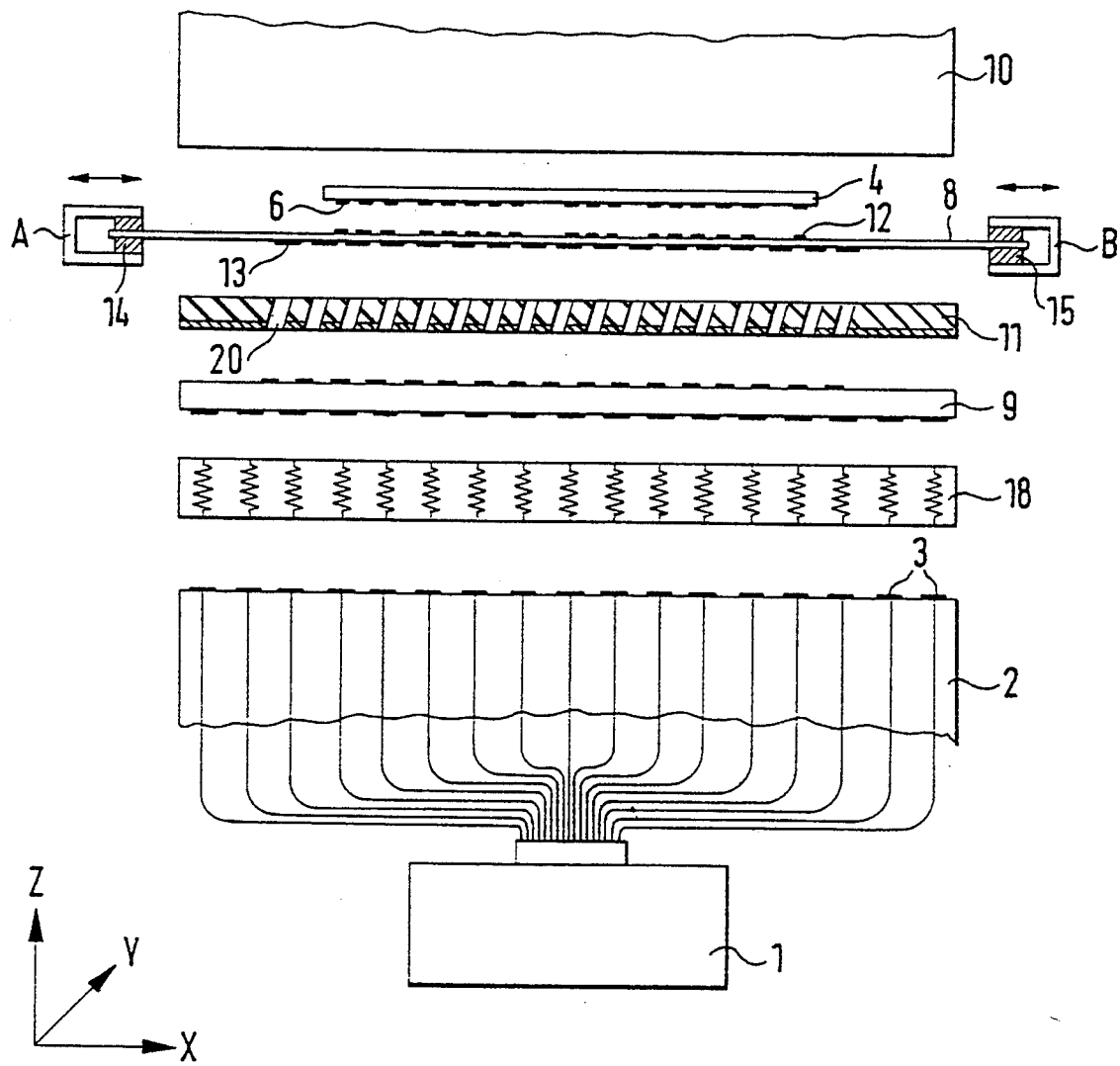
FIG. 1 depicts a printed circuit board testing device with the adapter arrangement according to the invention in an arrangement without test probes.
Figure 2:
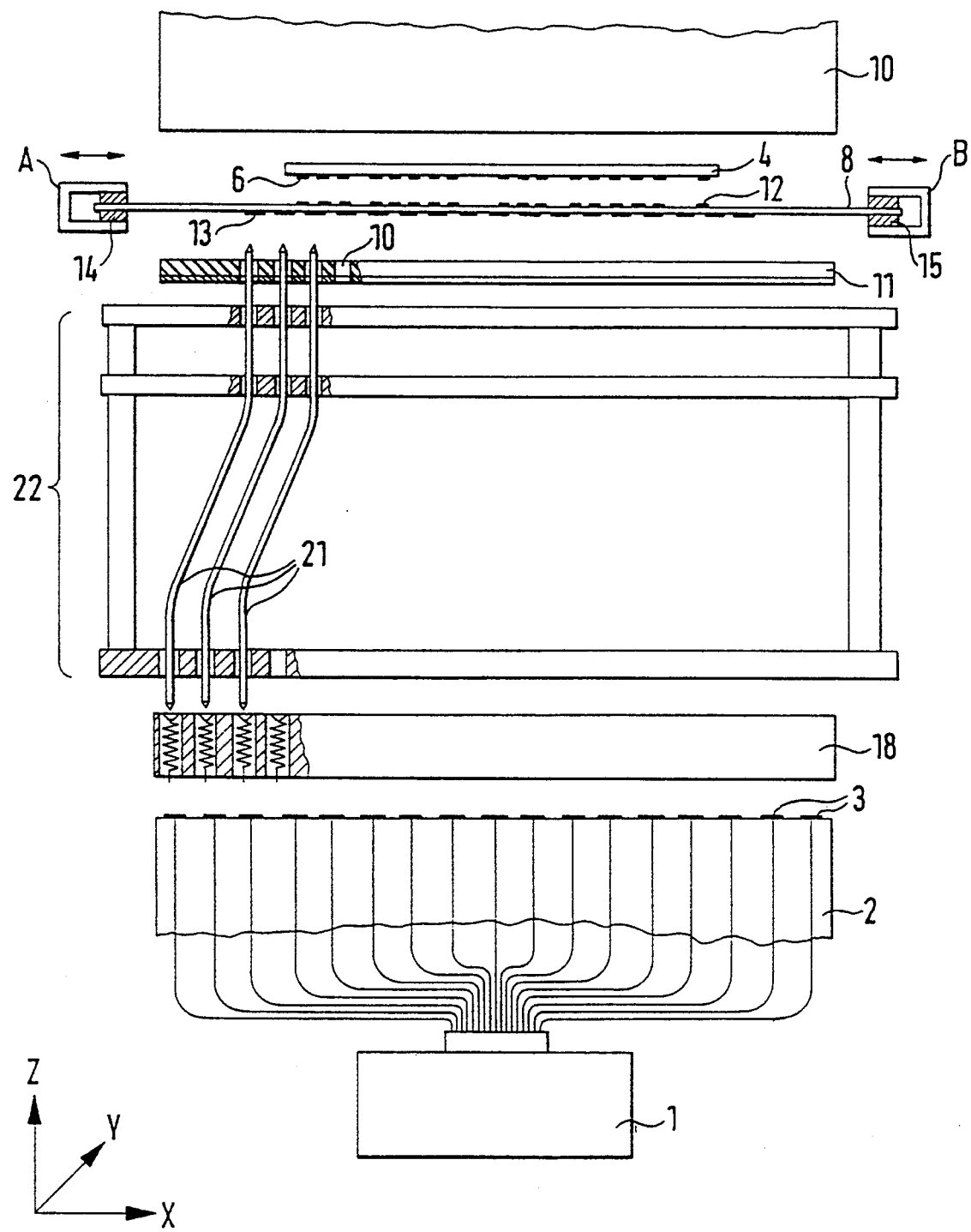
FIG. 2 depicts the printed circuit board testing device with the adapter arrangement according to the invention in conjunction with a conventional test probe adapter.

FIGS. 1 and 2 show in one representation two different embodiments of the printed circuit board testing device according to the invention, in which the individual elements are separated from each other in the vertical direction, i.e., in the direction of the Z-axis of the coordinate system shown, in order to better show the relationships. It should also be noted that the elements represent a three-dimensional object, whereby the representation is shown only in the X-Z plane, i.e., the plane of the drawing, and the third dimension (the Y coordinate perpendicular to the plane of the drawings) is not shown.

Figure 5:
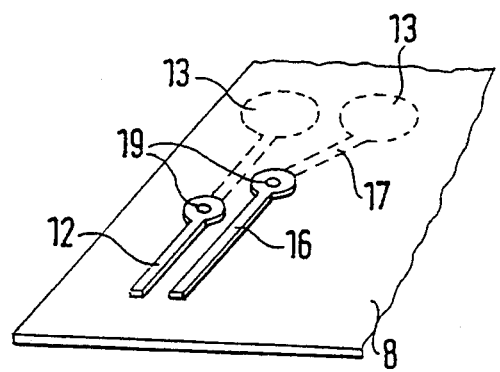
FIG. 5 depicts a perspective, fragmented representation of an adapters oil employed in the invention.

Reference numeral 2 denotes a printed circuit board tester, which is usually connected to a computer 1, having a regular basic grid 3 of contact points to connect the non grid-oriented test points or connecting points 6 of the;test specimen 4 with the aid of the adapter technique which will be described below. As is usual in the printed circuit board industry, the connecting points 6 on the wiring plane 4 (printed circuit board, ceramic substrate, etc.) are arranged practically in any way, i.e., they can for example be arranged to be partially grid-oriented and/or partially tightly packed locally, on the printed circuit board 4 to be tested, and frequently in fact with many hundreds or even thousands of test points/connection points 6 per printed circuit board/wiring plane 4. In order to connect these irregularly-arranged connection points to the regularly-arranged contacts of the basic grid 3 of the testing device 2, a flexible adapter foil 8 is provided, which, in accordance with the usual printed circuit board techniques, has to be manufactured as an individual printed circuit with contact areas or lands 12 and 13 on both sides of the adapter foil 8. Here the lands 13 facing the testing device 2 are arranged either exactly according to the basic grid 3 of the testing device, or in an intermediate grid which preferably is as regular as and/or more densely packed than the basic grid 3, on which a further conversion with known suitable adapter techniques (adapter plate 9, active basic grid 18) takes place, whereas the contact areas 12 on the side of the adapter foil 8 facing the test specimen are distributed according to the arrangement of test points or connecting points 6 of the test specimen 4. In this case each land 12 is connected to a corresponding land 13 on the other side of the adapter foil 8, i.e., according to usual printed circuit board techniques, with the aid of printed conductors 16, 17 on one of the two surfaces of the adapter foil, and plated-through holes 19, (shown only in FIG. 5), i.e., conducting areas in the adapter foil extending in the direction of the Z-axis, that is perpendicular to the adapter foil 8, so that the test current of the testing device can flow from one contact of the basic grid 3 via the components shown in the drawings, to the associated contact area 13 on the one side of the adapter foil and on to the other contact area 12 on the other side of the adapter foil, and from there to the connecting point 6 of the test specimen 4 to be tested.

Figure 6:
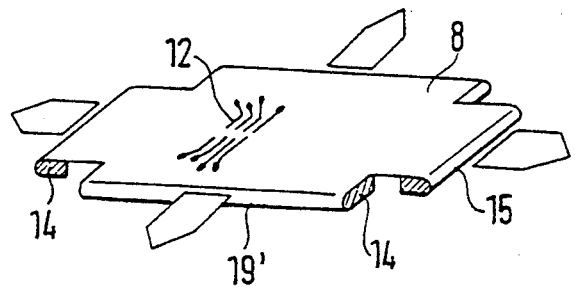
FIG. 6 depicts a perspective, schematic representation of the displacement and stretching possibilities of the adapter foil according to the invention.
Figure 4:
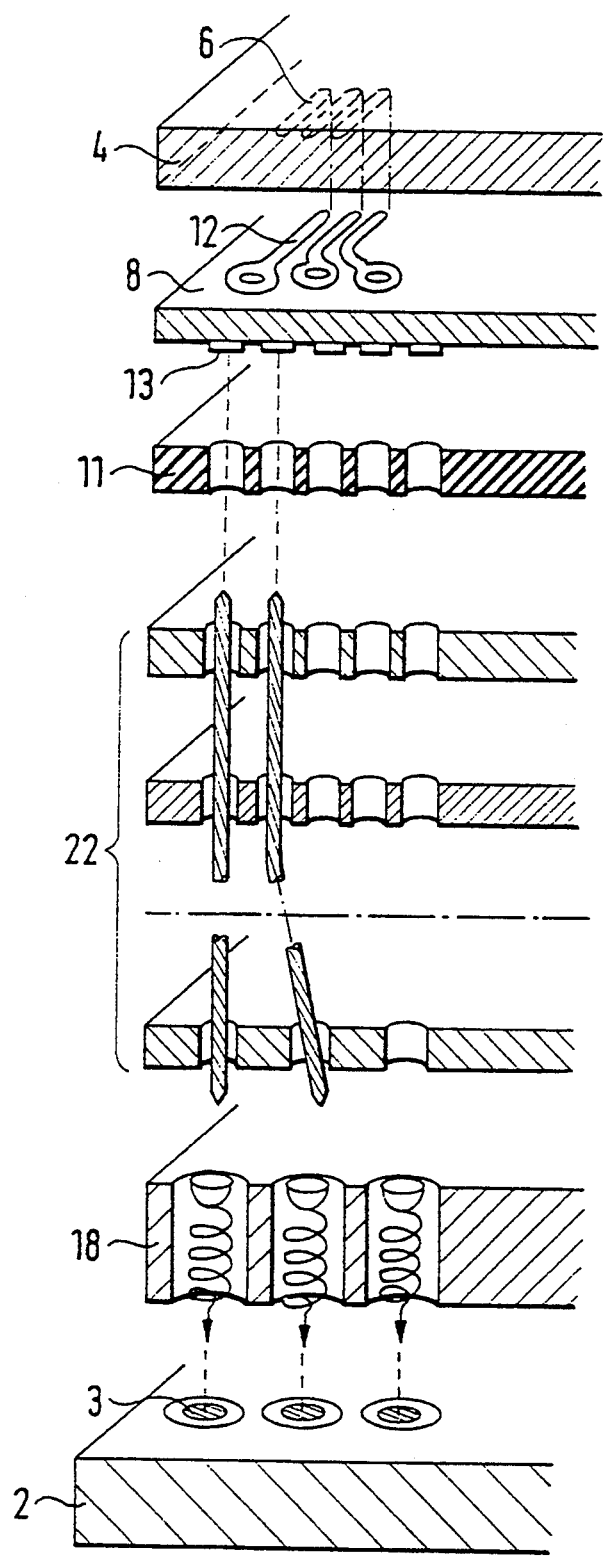
FIG. 4 depicts a schematic, fragmented, exploded view of an arrangement similar to FIG. 2.

With the aid of frame sections 14, 15 and 19 (FIG. 6) at its edges, the adapter foil 8 can be displaced or elastically elongated/stretched in the direction of its plane by a mechanical adjustment system A (not shown in detail) in order to adjust the position of the lands 12 on the side assigned to the test specimen 4 as required in relation to the test specimen, whose position is set by means of a suitable locating hole and an associated conical pin. Since the test contacts 6 on the test specimen and the corresponding mirror-image lands 12 on the adapter foil 8 are extraordinarily small and can therefore give rise to possible contact faults between the adapter foil and the test specimen due to manufacturing length tolerances between the test specimen and the adapter foil, the entire adapter foil can be displaced or elastically stretched within certain limits in order to achieve the necessary satisfactory contact at all contact points. A tensile force can also be selectively applied to various frame sections 14, 15. Only a very small amount of displacement and/or stretch in the adapter foil is usually necessary in order to achieve complete contact with the printed circuit board to be tested, without therefore the obviously larger and preferably regularly-arranged contact areas 13 on the side of the adapter foil 8 facing away from the test specimen disengaging from the associated conductors 20 or test probes 21 of the adapter arrangement.

Figure 3:
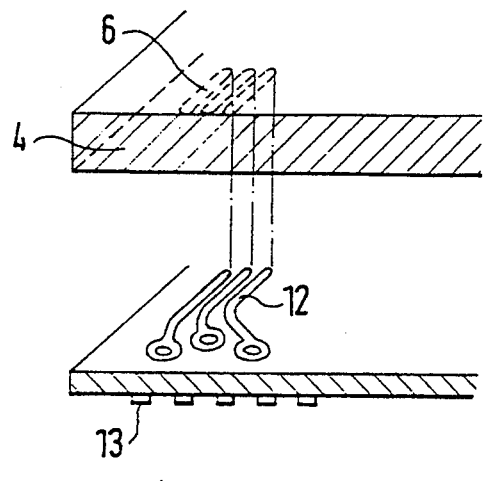
FIG. 3 depicts a schematic, fragmented, exploded view of the arrangement similar to FIG. 1.
Figure 3:
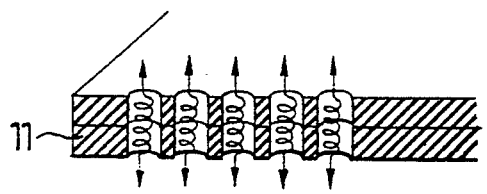
Figure 3:
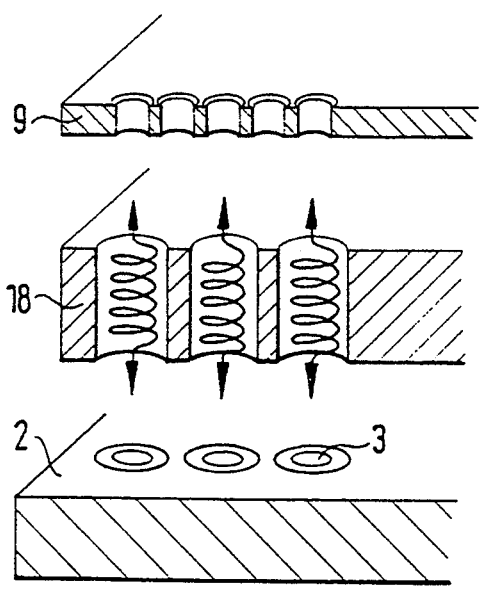

In the embodiment of FIGS. 1 and 3, the lands 13 of the adapter foil 8 are electrically connected via the conductors 20 of a flat continuous pressure-transmitting part 11 of elastically-compressible, non-conducting elastomer material. These conductors 20 are then in turn in contact with an adapter plate 9 which translates the preferably regular arrangement of conductors 20 or contact areas 13 into the basic grid of the testing device 2 as required, the adapter plate 9 being connected via a so-called active basic grid 18 to the contacts of the basic grid 3 of the testing device. The active basic grid is a conventional component which has spring contacts corresponding to the basic grid of the testing device 2, and provides the necessary contact pressure between the rigid contacts of the basic grid 3 of the testing device and the correspondingly arranged contact areas of the adapter plate 9.

In FIG. 2, a conventional test probe adapter 22 replaces the conductors 20 in the pressure-transmitting part 11, the adapter plate 9 and if necessary the active basic grid 18, inasmuch as it involves spring test probes. In this embodiment, the elastically-compressible pressure-transmitting part 11 (e.g., made of rubber) has holes or channels corresponding to the arrangement of adapter foil lands 13 and the test probes pass through these holes or channels in the pressure-transmitting part 11 and make contact with the lands 13. Here the entire area of the pressure-transmitting part 11 is pressed by the uppermost test probe guide plate of the conventional test probe adapter 22 in the direction of the adapter foil 8, thus producing the necessary elastic pressure force over the entire area of the adapter foil 8. In this case the test probe adapter connects in the known manner the contact areas 13 to the contacts 3 of the testing device and in this way translates, where necessary, from a closely-spaced grid in the adapter foil 8 to the basic grid of the testing device. It is perfectly possible to use a so-called full-grid test probe adapter, i.e., a test probe adapter in which all grid points are occupied by a test probe, even if not all of them are connected to the test specimen via the adapter foil, which gives the advantage that in spite of different adapter foils and test specimens, the same test probe adapter can be used. Examples of the conventional test probe adapters are described and claimed in the applicant's EP 26 824 B1, EP 315 707 B1 or EP 215 146, but these are always represented as special/individual adapters and not as full-grid test probe adapters.

The pressure-transmitting part 11 is preferably a rubber mat of sandwich construction, whereby the part lying against the adapter foil 8 is of compressible rubber and the part facing the printed circuit board testing device consists of a dimensionally-stable epoxy resin, for example, so that the pressure-transmitting part 11 is by and large compressible on one side in the vertical direction, i.e., in the direction of the Z-axis, but is dimensionally-stable in the X-Y plane. Such a pressure-transmitting part 11 of the embodiment of FIG. 2 can be provided with holes/channels of 10 to 0.5 mm diameter and less, in such a way that a sandwich arrangement of epoxy resin plate/rubber mat/epoxy resin plate is drilled in the clamped state, after which the top epoxy resin plate, which is merely required for the drilling operation, is removed and is not therefore glued to the rubber mat like the bottom epoxy resin plate.

In the embodiment in FIG. 1, the pressure-transmitting part 11 has conductors 20 arranged in the grid pattern of the contacts 13 and these are incorporated in the rubber mat and/or the sandwich construction of epoxy resin plate and rubber mat glued to it. As a result, these conductors 20 extend from the top face to the bottom face of this sandwich construction and form lands or contact areas arranged in the grid on the top and bottom faces. Here these conductors 20, which are preferably wires of 0.2 to 0.4 mm diameter, for example, are arranged obliquely to the plane of this pressure-transmitting part. This produces a spring compliance in the lands formed by them on the top and bottom faces in the direction of the Z-axis, i.e., the inclination of these conductors or wires 20 in the pressure-transmitting element 11 provides an electrically-conductive component at specific grid points in the vertical direction of the pressure-transmitting element 11, which does not have the drawbacks of the conventional vertical conducting plates, which has very thin and very close-spaced, fine gold wires extending perpendicularly to the plane of the plate, and whose spring compliance is merely due to their bending stress.

The conventional test probe adapter 22 shown in FIG. 2 is one such as is more precisely described in the above-mentioned EP 315 707 B1, for instance. But other conventional test probe adapter can be used. It is essential that the entire area of the uppermost test probe guide plate of the test probe adapter 22 in FIG. 2 makes contact with the lower side of the pressure-transmitting element 11 in FIG. 2 in order to achieve continuous, laminar support of the flexible foil 8 in this way.

In a concrete, preferred embodiment of a printed circuit board of the type described and discussed here, the adapter foil 8 consists of a polyamide material or (not quite so advantageous) an epoxy resin material, and the foils can have a thickness of 0.025 mm or 0.050 mm. Since the test contacts 6 of the printed circuit board 4 to be tested can have a width down to 0.1 mm, with a center-to-center distance down to 0.1 mm and less, the correspondingly arranged and formed lands 12 on the adapter foil 8 have a width or a diameter of approximately 0.015 to 0.020 mm, whereby copper with preferably a gold coating is used as the contact material. The lands 13 on the opposite side of the adapter foil have diameters down to about 0.6 mm, and the horizontal displacement or elongation of the adapter foil 8 is typically only 0.2 mm over an overall length of approximately 300 to 500 mm. As a result, any spontaneous deviations in the position of the test contacts 6 or the lands 12 from the reference position, which occur during the manufacture of the printed circuit boards to be tested, or during the manufacture of the adapter foil, can then be compensated very satisfactorily.

The pressure-transmitting part 11 in the embodiment of FIG. 1 consists, in a preferred embodiment, of a rubber mat of approximately 2 to 5 mm thickness, which can for example be glued to a thin epoxy resin plate in order to obtain reasonable stability in the X-Y plane. The conductors 20 in the form of wires are, for example, arranged in a 1.27 mm grid and have a typical thickness of 0.2 to 0.4 mm. These wires can be gold-plated or even gold.

What is claimed is:

1. A device for testing a printed circuit board having plural electrical contacts arranged in a first pattern on a surface thereof, said device comprising:
   a basic grid having plural test contacts arranged in a predetermined second pattern which is different from the first pattern of the printed circuit board to be tested and connectable to a computer which executes a predetermined printed circuit board test procedure;
   an adapter assembly for electrically connecting said plural test contacts of said basic grid to said plural electrical contacts of the printed circuit board to be tested, said adapter assembly including a flexible adapter foil having a first surface which faces towards said basic grid and a second surface which faces towards the printed circuit board to be tested, said first surface of said adapter foil having fixed thereto a first plurality of lands arranged in a predetermined third pattern and said second surface of said adapter foil having fixed thereto a second plurality of lands arranged corresponding to and in direct contact with the respective plural electrical contacts on the surface of the printed circuit board to be tested, each of said first plurality of lands being electrically connected to a corresponding one of said second plurality of lands; and
   a pressure device for urging the printed circuit board to be tested into operative contact with said adapter assembly;
   wherein said first plurality of lands arranged in said predetermined third pattern of said adapter foil are electrically connected to a respective one of said plural test contacts arranged in said second predetermined pattern of said basic grid; and
   wherein said adapter foil and the printed circuit board to be tested are displaceable relative to each other in their respective planes while the printed circuit board to be tested is retained in said device.

2. A device as claimed in claim 1, wherein said third pattern of said first plurality of lands of said adapter foil is in accordance with said second pattern of said test contacts of said basic gird.

3. A device as claimed in claim 1, wherein said third pattern of said first plurality of lands of said adapter foil is arranged in a higher density than said second pattern of said test contacts of said basic grid.

4. A device as claimed in claim 1, wherein said adapter assembly further comprises means for retaining said adapter foil at edges of said adapter foil and mechanically adjusting a position of said adapter foil in its plane.

5. A device as claimed in claim 1, wherein said assembly means including means for adjusting a position of said adapter foil to correct a deviation of the adapter board relative to a predetermined reference, the deviation being determined outside the test device.

6. A device as claimed in claim 1, wherein each of said first plurality of lands fixed to said adapter foil is larger than each of said second plurality of lands fixed to said adapter foil.

7. A device as claimed in claim 6, wherein said third pattern of said first plurality of lands of said adapter foil is in accordance with said second pattern of said test contacts of said basic gird.

8. A device as claimed in claim 6, wherein said third pattern of said first plurality of lands of said adapter foil is arranged in a higher density than said second pattern of said test contacts of said basic grid.

9. A device as claimed in claim 1, wherein said adapter foil of said adapter assembly is formed of an elastic material and is elastically stretchable in its plane.

10. A device as claimed in claim 9, wherein said third pattern of said first plurality of lands of said adapter foil is in accordance with said second pattern of said test contacts of said basic gird.

11. A device as claimed in claim 9, wherein said third pattern of said first plurality of lands of said adapter foil is arranged in a higher density than said second pattern of said test contacts of said basic grid.

12. A device as claimed in claim 9, wherein said adapter assembly further comprises means for retaining said adapter foil at edges of said adapter foil and mechanically adjusting and stretching a position of said adapter foil in its plane.

13. A device as claimed in claim 9, wherein each of said first plurality of lands fixed to said adapter foil is larger than each of said second plurality of lands fixed to said adapter foil.

14. A device as claimed in claim 13, wherein said third pattern of said first plurality of lands of said adapter foil is in accordance with said second pattern of said test contacts of said basic gird.

15. A device as claimed in claim 13, wherein said third pattern of said first plurality of lands of said adapter foil is arranged in a higher density than said second pattern of said test contacts of said basic grid.

16. A device as claimed in claim 1, wherein said adapter assembly further comprises a flat continuous member made of an electrically insulating and elastically compressable material located between said adapter foil and said basic grid and in contact with said first surface of said adapter foil, said flat continuous member including channels extending therethrough which are arranged corresponding to said first plurality of lands of said adapter foil.

17. A device as claimed in claim 16, wherein said flat continuous member includes a first layer of said electrically insulating and elastically compressible material and a second layer of a relatively rigid material, said first layer confronting said adapter foil and said second layer facing towards said basic grid.

18. A device as claimed in claim 16, wherein said adapter assembly further comprises a plurality of conductors respectively extending through said channels of said flat continuous member in contact with said first plurality of lands of said adapter foil, said plurality of conductors electrically connected to said test contacts of said basic grid.

19. A device as claimed in claim 18, wherein said flat continuous member includes a first layer of said electrically insulating and elastically compressible material and a second layer of a relatively rigid material, said first layer confronting said adapter foil and said second layer facing towards said basic grid.

20. A device as claimed in claim 18, wherein said adapter assembly further comprises a test probe adapter located between said flat continuous member and said basic grid and containing said plurality of conductors, said test probe adapter including a test probe guide plate in pressure transmitting contact with a surface of said flat continuous member.

21. A device as claimed in claim 20, further comprising at least one of an adapter plate and an active basic grid located between said test probe adapter and said basic grid.

22. A device as claimed in claim 18, wherein said plurality of conductors are incorporated within said flat continuous member and extend through said flat continuous member from opposite surfaces of said flat continuous member.

23. A device as claimed in claim 22, further comprising at least one of an adapter plate and an active basic grid located between said flat continuous member and said basic grid.

24. A device as claimed in claim 22, wherein said plurality of conductors extend obliquely within said flat continuous member between said opposite surfaces of said flat continuous member.

25. A device as claimed in claim 24, further comprising at least one of an adapter plate and an active basic grid located between said flat continuous member and said basic grid.

* * * * *